US009928924B2

United States Patent
Chun et al.

(10) Patent No.: US 9,928,924 B2
(45) Date of Patent: Mar. 27, 2018

(54) SYSTEMS, METHODS, AND COMPUTER PROGRAMS FOR RESOLVING DRAM DEFECTS

(71) Applicant: QUALCOMM INCORPORATED, San Diego, CA (US)

(72) Inventors: Dexter Tamio Chun, San Diego, CA (US); Yanru Li, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 14/970,273

(22) Filed: Dec. 15, 2015

(65) Prior Publication Data
US 2017/0169902 A1    Jun. 15, 2017

(51) Int. Cl.
G11C 29/42 (2006.01)
G06F 11/10 (2006.01)
G06F 12/02 (2006.01)
G06F 13/24 (2006.01)
G11C 7/10 (2006.01)
G06F 12/08 (2016.01)
G06F 12/0875 (2016.01)

(52) U.S. Cl.
CPC .......... G11C 29/42 (2013.01); G06F 11/1016 (2013.01); G06F 11/1064 (2013.01); G06F 11/1072 (2013.01); G06F 12/0246 (2013.01); G06F 12/0875 (2013.01); G06F 13/24 (2013.01); G11C 7/1072 (2013.01)

(58) Field of Classification Search
CPC ... G11C 29/42; G11C 7/1072; G06F 11/1016; G06F 11/1064; G06F 11/1072; G06F 12/0246; G06F 12/0875; G06F 13/24
See application file for complete search history.

(56) References Cited

U.S. PATENT DOCUMENTS

| 7,805,658 B2 | 9/2010 | Luk et al. |
| 9,037,949 B1 | 5/2015 | Vogelsang et al. |
| 9,069,717 B1 | 6/2015 | Wang et al. |
| 9,286,172 B2* | 3/2016 | Ramirez ............ G06F 11/2053 |
| 9,432,298 B1* | 8/2016 | Smith ................. H04L 49/9057 |
| 2012/0192027 A1* | 7/2012 | Tran ................... H03K 19/0016 714/752 |
| 2012/0243299 A1 | 9/2012 | Shau |

(Continued)

FOREIGN PATENT DOCUMENTS

EP    2921959 A1    9/2015

OTHER PUBLICATIONS

Partial International Search Report—PCT/US2016/062574—ISA/EPO—Feb. 2, 2017.

(Continued)

*Primary Examiner* — Kyle Vallecillo
(74) *Attorney, Agent, or Firm* — Smith Tempel Blaha LLC

(57) ABSTRACT

Systems, methods, and computer programs are disclosed for resolving dynamic random access memory (DRAM) defects. One embodiment is a system comprising a dynamic random access memory (DRAM) system electrically coupled to a system on chip (SoC). The SoC comprises a cache and a cache controller. The cache controller is configured to store corrected data for a failed physical codeword address associated with the DRAM in the cache and provide further access to the failed physical codeword address from the cache instead of the DRAM system.

29 Claims, 12 Drawing Sheets

(56) References Cited

U.S. PATENT DOCUMENTS

| | | | |
|---|---|---|---|
| 2013/0212431 A1* | 8/2013 | Ong | G06F 15/167 |
| | | | 714/15 |
| 2014/0019823 A1* | 1/2014 | Ramirez | G06F 11/1064 |
| | | | 714/755 |
| 2014/0082453 A1* | 3/2014 | Sikdar | G11C 29/808 |
| | | | 714/763 |
| 2014/0143487 A1* | 5/2014 | Habusha | G06F 12/0831 |
| | | | 711/105 |
| 2014/0157065 A1* | 6/2014 | Ong | G11C 29/12 |
| | | | 714/718 |
| 2014/0281677 A1* | 9/2014 | Koike | G06F 11/0727 |
| | | | 714/6.1 |
| 2015/0143198 A1 | 5/2015 | Chun et al. | |
| 2015/0149864 A1 | 5/2015 | Kim et al. | |
| 2015/0186198 A1 | 7/2015 | Dong et al. | |

OTHER PUBLICATIONS

International Search Report and Written Opinion—PCT/US2016/062574—ISA/EPO—dated Mar. 27, 2017.

* cited by examiner

| CODEWORD ADDRESS 301 | ERROR COUNT 303 |
|---|---|
| 0xFEEDBABE0 | 0x1 |
| 0x0000CAFE0 | 0x2 |
| 0x00000DAD0 | 0x3 |

| DRAM REFRESH INTERVAL 502 | FAILED CODEWORD ADDRESS 504 |
|---|---|
| t1 | 0xFEEDBABE0 |
| t2 | 0x00000CAFE0 |
| t2 | 0x00000DAD0 |
| t3 | 0x1234356789 |

| Way0 | 2048 | ... | n | 7 | 6 | 5 | 4 | 3 | 2 | 1 |
| Way1 | 2048 | ... | n | 7 | 6 | 5 | 4 | 3 | 2 | 1 |
| Way2 | 2048 | ... | n | 7 | 6 | 5 | 4 | 3 | 2 | 1 |
| Way3 | 2048 | ... | n | 7 | 6 | 5 | 4 | 3 | 2 | 1 |

......  ......

| Way6 | 2048 | ... | n | 7 | 6 | 5 | 4 | 3 | 2 | 1 |
| Way7 | 2048 | ... | n | 7 | 6 | 5 | 4 | 3 | 2 | 1 |

*FIG. 11*

SYSTEMS, METHODS, AND COMPUTER PROGRAMS FOR RESOLVING DRAM DEFECTS

DESCRIPTION OF THE RELATED ART

Dynamic random access memory (DRAM) manufacturing process technology continues to scale down to accommodate increasing demands for greater memory capacity in smaller chips. The common measure of DRAM process technology is half-pitch, which refers to half the distance between cells in a DRAM chip. Current DRAM process technology produces DRAM chips with a half-pitch in the range of 20-30 nanometer (nm), although it is expected that improvements in process technology will scale down to less than 20 nm in the near future.

While denser DRAM chips provide desirable performance and design advantages, the shrinking geometry produces many challenges. For example, as DRAM process technology continues to scale down, there will be a proportionate decrease in cell capacitance, which increases cell transistor leakage. The normal distribution of cell retention across the DRAM die will not tighten, and overall it will continue to exhibit "tails" with some cells having a significant variance in cell retention compared to the mean. Reliably maintaining data in these "tails" may either require a significant increase in the frequency of refresh or, alternatively, an error recovery scheme, such as, block error correction. Block error correction may be required along with refresh to read-correct-write the data stored in the DRAM. In the latter case, wear over the lifetime of the device may lead to an accumulation of errors. Correcting multiple simultaneous errors on a DRAM requires significant silicon area. Furthermore, increasing the frequency of refresh adversely impacts the available memory bandwidth and also raises the standby power consumption.

Accordingly, there is a need for improved systems and methods that provide a cost-effective and efficient way to address the problem of defective DRAM cells, particularly as DRAM process technology continues to scale down.

SUMMARY OF THE DISCLOSURE

Systems, methods, and computer programs are disclosed for resolving dynamic random access memory (DRAM) defects. One embodiment is a system comprising a dynamic random access memory (DRAM) system electrically coupled to a system on chip (SoC). The SoC comprises a cache and a cache controller. The cache controller is configured to store corrected data for a failed physical codeword address associated with the DRAM in the cache and provide further access to the failed physical codeword address from the cache instead of the DRAM system.

Another embodiment is a method for resolving dynamic random access memory (DRAM) defects. The method comprises identifying a failed physical codeword address in a dynamic random access memory (DRAM) electrically coupled to a system on chip (SoC). Error-corrected data associated with the failed physical codeword address is fetched from the DRAM. The error-corrected data is stored in a cache residing on the SoC. Memory transactions for the failed physical codeword address are serviced from the cache instead of the DRAM.

BRIEF DESCRIPTION OF THE DRAWINGS

In the Figures, like reference numerals refer to like parts throughout the various views unless otherwise indicated. For reference numerals with letter character designations such as "102A" or "102B", the letter character designations may differentiate two like parts or elements present in the same Figure. Letter character designations for reference numerals may be omitted when it is intended that a reference numeral to encompass all parts having the same reference numeral in all Figures.

FIG. 3 is a data diagram illustrating an embodiment of a failed codeword address table for implementing certain aspects of a method for resolving DRAM defects in the system of FIG. 1.

FIG. 5 is a data diagram illustrating an embodiment of a bad physical address map in the system of FIG. 1.

FIG. 11 is a data diagram illustrating an embodiment of a cache physical structure comprising a set/way partition for limiting a number of failure addresses in the DRAM to be stored in the cache due to a cache allocation conflict.

DETAILED DESCRIPTION

The word "exemplary" is used herein to mean "serving as an example, instance, or illustration." Any aspect described herein as "exemplary" is not necessarily to be construed as preferred or advantageous over other aspects.

In this description, the term "application" may also include files having executable content, such as: object code, scripts, byte code, markup language files, and patches. In addition, an "application" referred to herein, may also include files that are not executable in nature, such as documents that may need to be opened or other data files that need to be accessed.

The term "content" may also include files having executable content, such as: object code, scripts, byte code, markup language files, and patches. In addition, "content" referred to herein, may also include files that are not executable in nature, such as documents that may need to be opened or other data files that need to be accessed.

As used in this description, the terms "component," "database," "module," "system," and the like are intended to refer to a computer-related entity, either hardware, firmware, a combination of hardware and software, software, or software in execution. For example, a component may be, but is not limited to being, a process running on a processor, a processor, an object, an executable, a thread of execution, a program, and/or a computer. By way of illustration, both an application running on a computing device and the computing device may be a component. One or more components may reside within a process and/or thread of execution, and a component may be localized on one computer and/or distributed between two or more computers. In addition, these components may execute from various computer readable media having various data structures stored thereon. The components may communicate by way of local and/or remote processes such as in accordance with a signal having one or more data packets (e.g., data from one component interacting with another component in a local system, distributed system, and/or across a network such as the Internet with other systems by way of the signal).

In this description, the terms "communication device," "wireless device," "wireless telephone", "wireless communication device," and "wireless handset" are used interchangeably. With the advent of third generation ("3G") wireless technology and four generation ("4G"), greater bandwidth availability has enabled more portable computing devices with a greater variety of wireless capabilities. Therefore, a portable computing device may include a cellular telephone, a pager, a PDA, a smartphone, a navigation device, or a hand-held computer with a wireless connection or link.

Figure 1:
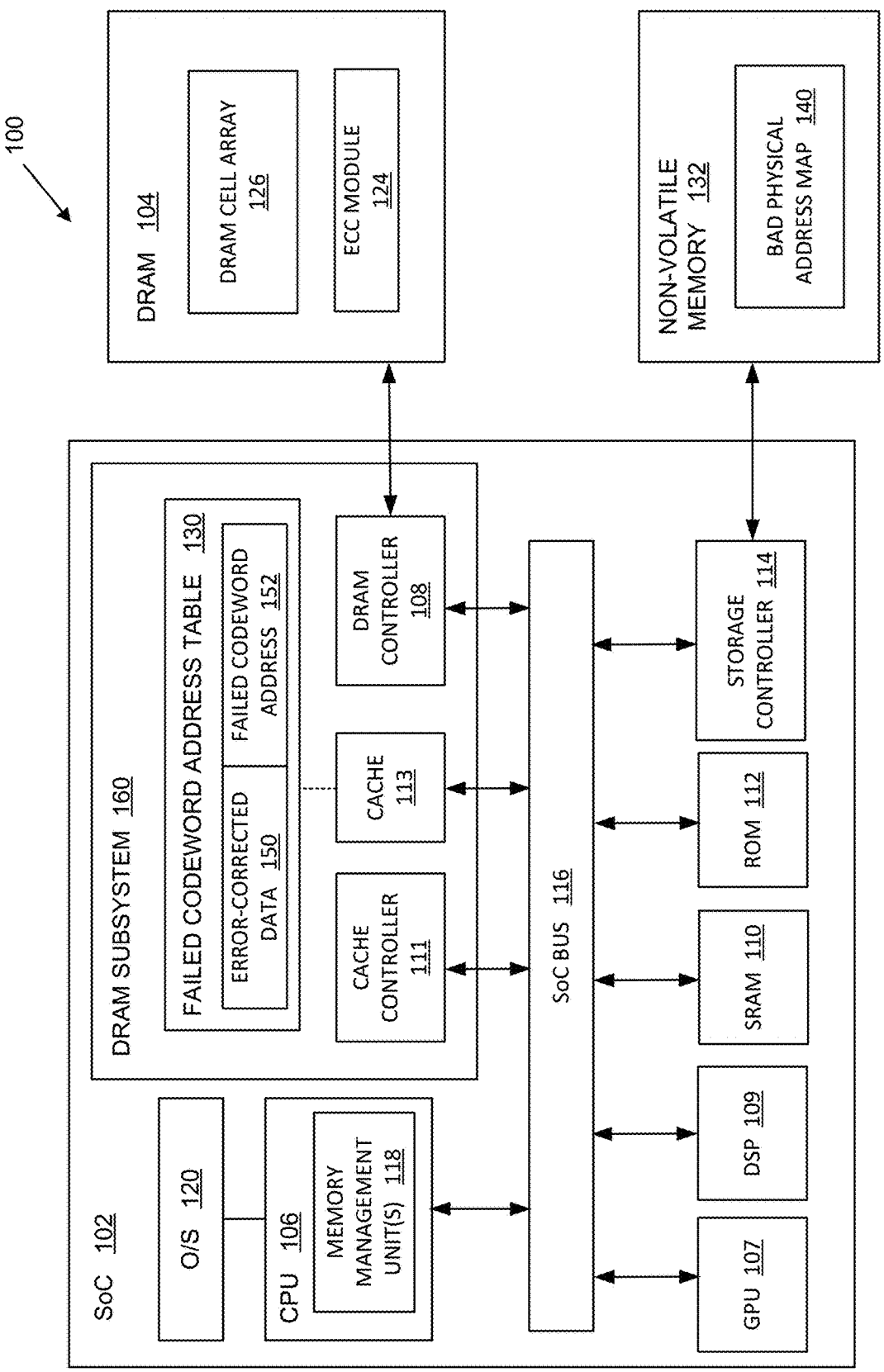
FIG. 1 is a block diagram of an embodiment of a system for resolving DRAM defects.

FIG. 1 illustrates a system 100 for resolving defects in dynamic random access memory (DRAM) cells. The system 100 may be implemented in any computing device, including a personal computer, a workstation, a server, or a portable computing device (PCD), such as a cellular telephone, a smart phone, a portable digital assistant (PDA), a portable game console, or a tablet computer. As illustrated in the embodiment of FIG. 1, the system 100 comprises a system on chip (SoC) 102 electrically coupled to a DRAM memory system 104 and a non-volatile memory 132. The non-volatile memory 132 may comprise any non-volatile memory, such as, for example, flash memory, flash drive, a Secure Digital (SD) card, a solid-state drive (SSD), or other types.

The SoC 102 comprises various on-chip components, including one or more memory clients, a DRAM controller 108, static random access memory (SRAM) 110, read only memory (ROM) 112, and a storage controller 114 interconnected via a SoC bus 116. The memory clients request memory resources from DRAM 104. The memory clients may comprise one or more processing units (e.g., central processing unit (CPU) 106, a graphics processing unit (GPU) 107, a digital signal processor (DSP) 109, etc.), a video encoder, or other clients requesting read/write access to DRAM system 104.

Storage controller 114 on SoC 102 is electrically coupled to non-volatile memory 132. Storage controller 114 manages the data stored on non-volatile memory 132. DRAM controller 108 is electrically coupled to DRAM 104 via, for example, a RAM bus. DRAM controller 108 manages the flow of data going to and from the DRAM 104. DRAM controller 108 generally comprises the logic for reading and writing to DRAM 104.

As generally illustrated in FIG. 1 and described below in more detail, the system 100 resolves DRAM defects using an on-chip memory (e.g., a system cache 113, a non-cache static random access memory (SRAM), etc.) to store failed physical codeword addresses 152 and the error-corrected data 150 associated with the address. The failed codeword addresses 152 and associated error-corrected data 150 may be stored in a failed codeword address table 130. When an error occurs while any of the memory clients are accessing the DRAM 104 (e.g., a read or write operation), an error correction code (ECC) module 124 corrects the error associated with the DRAM cell array 126. The DRAM 104 may temporarily store the error-corrected data 150 for the failed codeword addresses 152.

As illustrated in the embodiment of FIG. 1, the SoC 102 may comprise a DRAM subsystem 160. The DRAM subsystem 160 may comprise the cache controller 111, the on-chip memory (e.g., system cache 113), and the DRAM controller 108. The DRAM subsystem 160 may maintain the failed codeword address table 130 for keeping track of an error count, which may be used to determine that physical addresses are weakening and/or have failed. In response to an error and the system 100 identifying the failed physical codeword address 152, the cache controller 111 may instruct the cache 113 to store the error-corrected data 150 from the failed codeword address 152 and prevent further access to the failed physical codeword address 152. It should be appreciated that the on-chip memory used to store the error-corrected data 150 may comprise a system cache 113 (as illustrated in FIG. 1) or other on-chip memory, such as, for example, a non-cache SRAM 110, etc. In the embodiment of FIG. 1 where a system cache 113 is used, the cache controller 111 may be configured to lock a cache line associated with the failed codeword address 152 such that the error-corrected data 150 is accessed via the system cache 113 rather than the DRAM 104. In this manner, it should be appreciated that the system 100 may abstract the physical memory being used for the address and thereby provide error-free memory to the memory clients via on-chip memory in the event of DRAM cell defects impacting physical codeword addresses 152.

In embodiments in which on-chip memory is used instead of system cache 113, a look-up table may be generated to list the address being stored in the on-chip memory. The DRAM controller 108 checks the look-up table for each transaction and, if there is a match, the transaction is redirected to the on-chip memory, and the DRAM bad address is not accessed. Furthermore, the system power consumption and performance may be tuned through a method of identifying failed addresses and dynamically adjusting the amount of data stored in the on-chip memory.

The ECC module 124 detects double-bit errors and corrects single-bit errors during DRAM operations (e.g., read and/or write operations). For example, during a DRAM write operation, the ECC module 124 may use the write data as input and then generate redundant parity check bits. The combined write data and parity check bits together form a unit known as a codeword and may be stored either separated or together in the DRAM cell array 126. During a read operation, the ECC module 124 may use the retrieved data portion of the codeword to recomputed the parity check bits and then compare these against the parity check bits portion of the codeword that was stored during the write operation. A mismatch between the read recomputed parity and the stored parity indicates a detected error. In addition, the parity check bits may be sufficient to provide single error correction within the codeword.

The ECC module 124 may be integrated as a component in DRAM 104 (as shown in FIG. 1) or in SoC 102. One of ordinary skill in the art will appreciate that DRAM bit errors may have several underlying causes, such as, for example, latent silicon defect, particle or electromagnetic wave disruption of charge, or weak capacitor retention, any of which may result in a codeword error.

Figure 2:
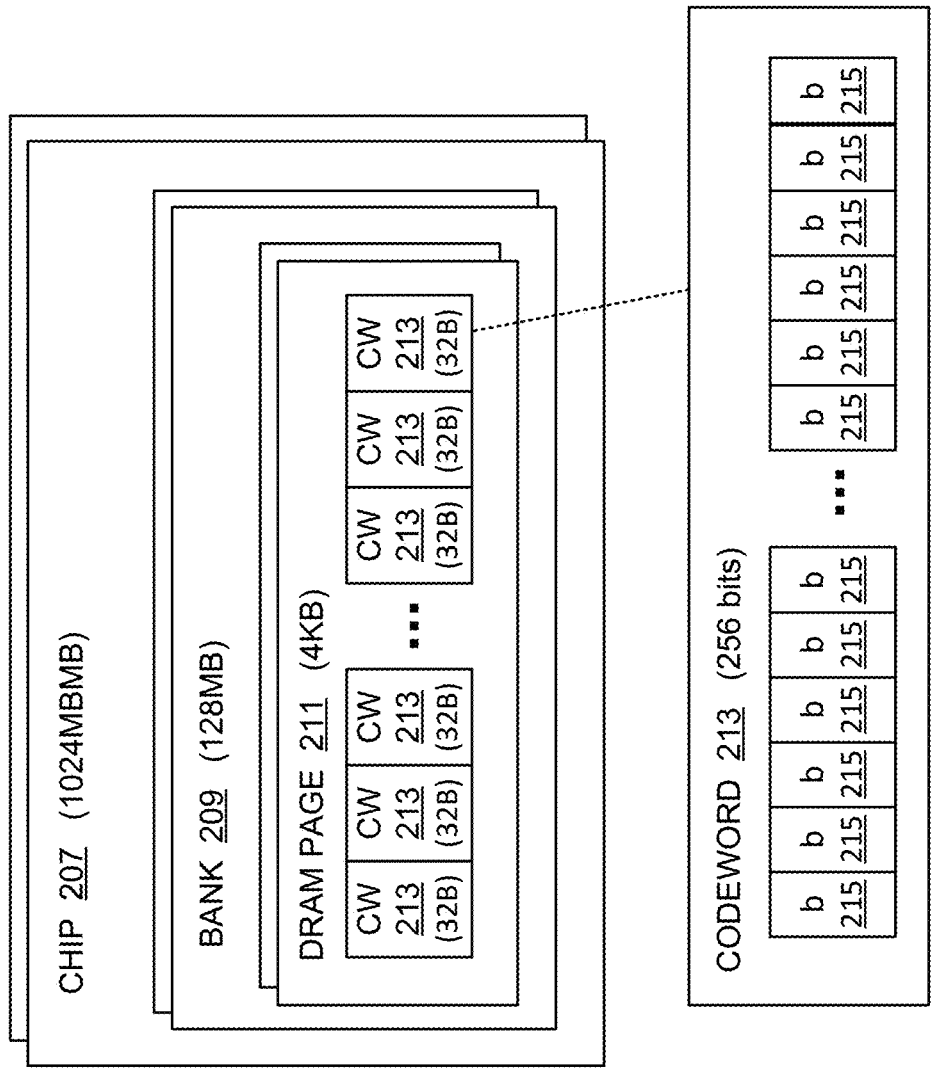
FIG. 2 is a block diagram illustrating a more detailed view of the physical architecture of an embodiment of the DRAM system in FIG. 1.

FIG. 2 illustrates an exemplary embodiment of a DRAM system 104, which comprises one or more DRAM chips 207. As known in the art, each DRAM chip 207 may comprise a plurality of banks 209 with each bank 209 defining a plurality of DRAM pages 211. A DRAM page 211 comprises a plurality of codewords 213. A codeword 213 comprises a plurality of bits 215 in DRAM cell array 126. FIG. 2 shows a codeword 213 comprising 256 bits of data and corresponding to a physical address (0x00000DAD0).

As known in the art, in operation, the ECC module 124 may detect and correct failed bits, thereby enabling a successful DRAM operation despite the failed bit. ECC module 124 may temporarily store the error data (e.g., error-corrected data 150) in, for example, a volatile register/RAM in the DRAM 104. The error data may comprise information pertaining to the ECC failure, such as, for example, the start address of the most recent failed codewords and whether the error was successfully corrected or not. The error data may not be directly addressable by SoC software but made available via DRAM controller 108 to query the DRAM 104 for the error data. As mentioned above, when the system 100 determines the failed physical codeword address 152, the error data may be read from the ECC module 124. It should be appreciated that the DRAM 104 may use a combination of dedicated hardware signals and/or internal read/write registers to indicate to the SoC 102 the error information of the on-going transaction. The error information may comprise, for example, a type of error, whether the error is corrected, and any uncorrectable errors.

FIG. 3 illustrates an exemplary embodiment of a failed codeword address table 130 used by the system 100 to determine when a physical codeword address 301 is deemed to have failed. An error count 303 may keep track of a number of times that a failed codeword address 301 has encountered an error. As new locations have errors, the number of entries in the failed codeword address table 130 increases. As errors repeat for the same codeword address 301, the error count 303 increments. As illustrated in FIG. 3, the failed codeword address table 130 may comprise a data field 301 for listing the physical address corresponding to the failed codeword 213 (FIG. 2). A data field 303 includes an error count of accumulated errors for the failed codeword address. It should be appreciated that the error count data field 303 may be accessed by the cache controller 111 or other on-chip or off-chip component(s) to determine when a physical address has weakened and/or failed and, therefore, should no longer be accessed. For example, if the error count for a codeword address 213 exceeds a predetermined threshold, the physical location in DRAM 104 may be defined as a failed codeword address 152 and, in response, the cache controller 111 may instruct the cache 113 to store the error-corrected data 150 from the failed codeword address 152 and prevent further access to the failed physical codeword address 152.

Figure 4:
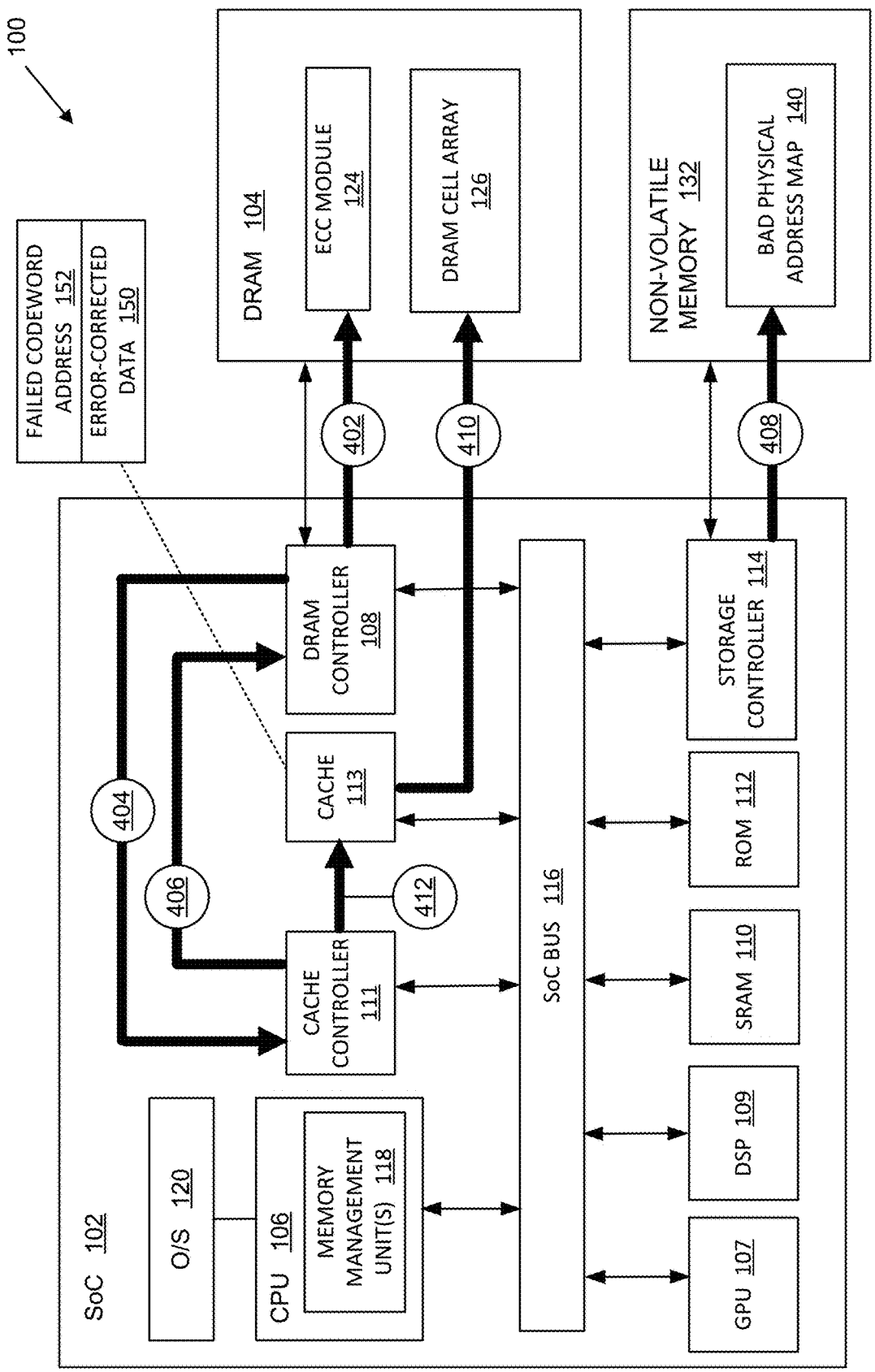
FIG. 4 is a block diagram illustrating an embodiment of a method for resolving DRAM defects in the system of FIG. 1.

FIG. 4 illustrates an embodiment of a method implemented in the system 100 for resolving DRAM defects using the system cache 113 and the cache controller 111. As illustrated at reference numeral 402, the DRAM controller 108 may conduct a background process to screen DRAM physical addresses, check register(s), or otherwise determine if an ECC error has occurred. When an ECC error occurs, the DRAM controller 108 may send an interrupt signal to the cache controller 111 (reference numeral 404). It should be appreciated that the cache controller 111 generally comprises a resource manager. The cache controller 111 may comprise hardware logic within the system cache 113, a separate hardware block, or software executing on, for example, a system hypervisor. In response to the interrupt signal, the cache controller 111 may query the DRAM controller 108, at reference numeral 406, for the error-corrected data 150 associated with the failed codeword address 152. The cache controller 111 may be configured to determine if the failed codeword address 152 exceeds a threshold, as described above in connection with the failed codeword address table 130 (FIG. 3). If the threshold is exceeded or otherwise identified as being weak or failed, the physical address is identified as a failed codeword address 152.

At reference numeral 408, the cache controller 111 may update a bad physical address map 140 stored in the non-volatile memory 132 with the failed codeword address 152. The cache controller 111 may directly instruct the storage controller 114 to update the bad physical address map 140. In another embodiment, the cache controller 111 may communicate with the storage controller 114 via a storage driver in an operating system (O/S) 120. At reference numeral 410, the system cache 113 may fetch the error-corrected data 150 associated with the failed codeword address 152 from the DRAM 104. As illustrated at reference numeral 412, the cache controller 111 may be configured to lock a cache line associated with the failed codeword address 152 such that the error-corrected data 150 is accessed via the system cache 113 rather than the DRAM 104. It should be appreciated that when the cacheline is locked any clean or invalidate operation(s) from any memory clients will not take effect. The cacheline locking/unlocking mechanism is controlled by the cache controller 111.

In another embodiment, the system 100 may be configured to adjust the DRAM refresh rate to selectively control system power consumption and performance. One of ordinary skill in the art will appreciate that, because the system 100 can disable access to weak and/or failed DRAM cells, the DRAM refresh rate may be reduced to save system power consumption. The system 100 may be configured to determine the DRAM refresh rate at which particular physical addresses fail. Based on system performance and power trade-offs, a higher rate of system cache 113 being used as normal cache (i.e., not locked for filtering bad DRAM access) may be desired when the system 100 is running high performance use cases. Using the bad physical address map 140, a failed/bad address locking/filtering mechanism provided via the system cache 113 may be controlled to adjust the DRAM refresh rate and unlock the failed codeword addresses 152 that are functional under the DRAM refresh rate.

It should be appreciated that damaged or weakened DRAM cells may have relatively higher leakage and, therefore, need a relatively higher refresh rate than other DRAM cells. Depending on the level of damage or weakening, different DRAM cells can fail at different refresh rates. In this regard, system 100 may determine the DRAM refresh rate at which particular physical addresses fail and store the data in the bad physical address map 140.

FIG. 5 illustrates an exemplary embodiment of the bad physical address map 140. Column 502 may specify the DRAM refresh rate (e.g., t1, t2, t3, etc.) at which the codeword addresses identified in column 504 will fail. In an embodiment, the bad physical address map 140 may be generated during a DRAM initialization process at boot time. The system 100 may test the DRAM 104 at various refresh rates and store the data in the non-volatile memory 132. In another embodiment, the bad physical address map 140 may be generated during system run time. The system 100 may execute a background process at a very low frequency to screen and test the DRAM 104 at different frequency points. The DRAM refresh rate may be adjusted as operation temperature changes. The failed codeword address identified in column 504 may be aligned according to cache lines and the ECC codeword size.

Figure 6:
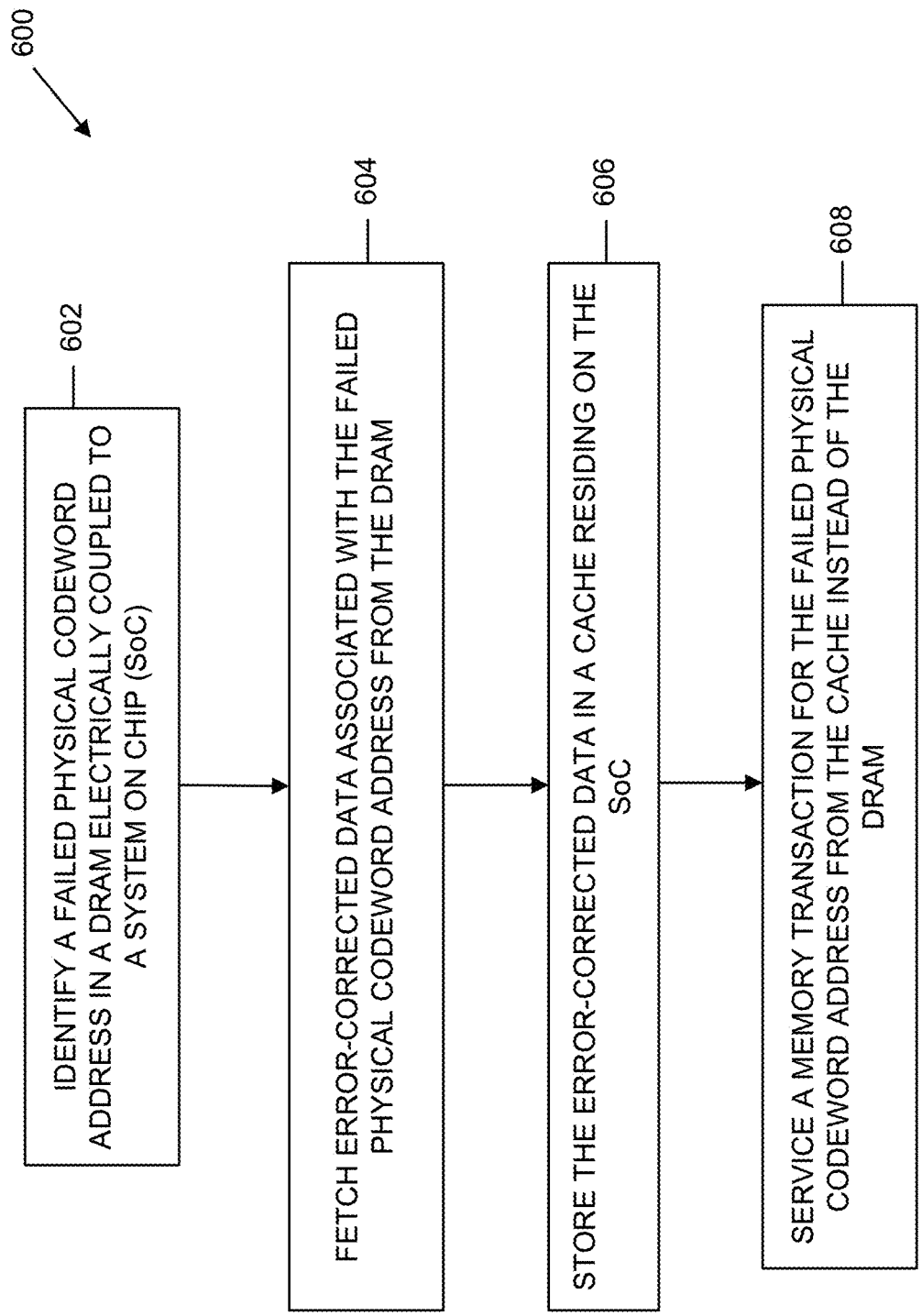
FIG. 6 is a flowchart illustrating an embodiment of a method implemented in the system of FIG. 1 for resolving DRAM defects.

FIG. 6 is a flowchart illustrating an embodiment of a method 600 implemented in the system of FIG. 1 for resolving DRAM defects. At block 602, the system 100 identifies a failed physical codeword address 152. At block 604, the error-corrected data 150 associated with the failed physical codeword address 152 is fetched from the DRAM 104. At block 606, the error-corrected data 150 is stored in the system cache 113 (or other on-chip memory) residing on the SoC 102. At block 608, the system 100 services further memory transactions (e.g., read or write operations) for the failed physical codeword address 152 from the system cache 113 instead of the DRAM 104.

Figure 7:
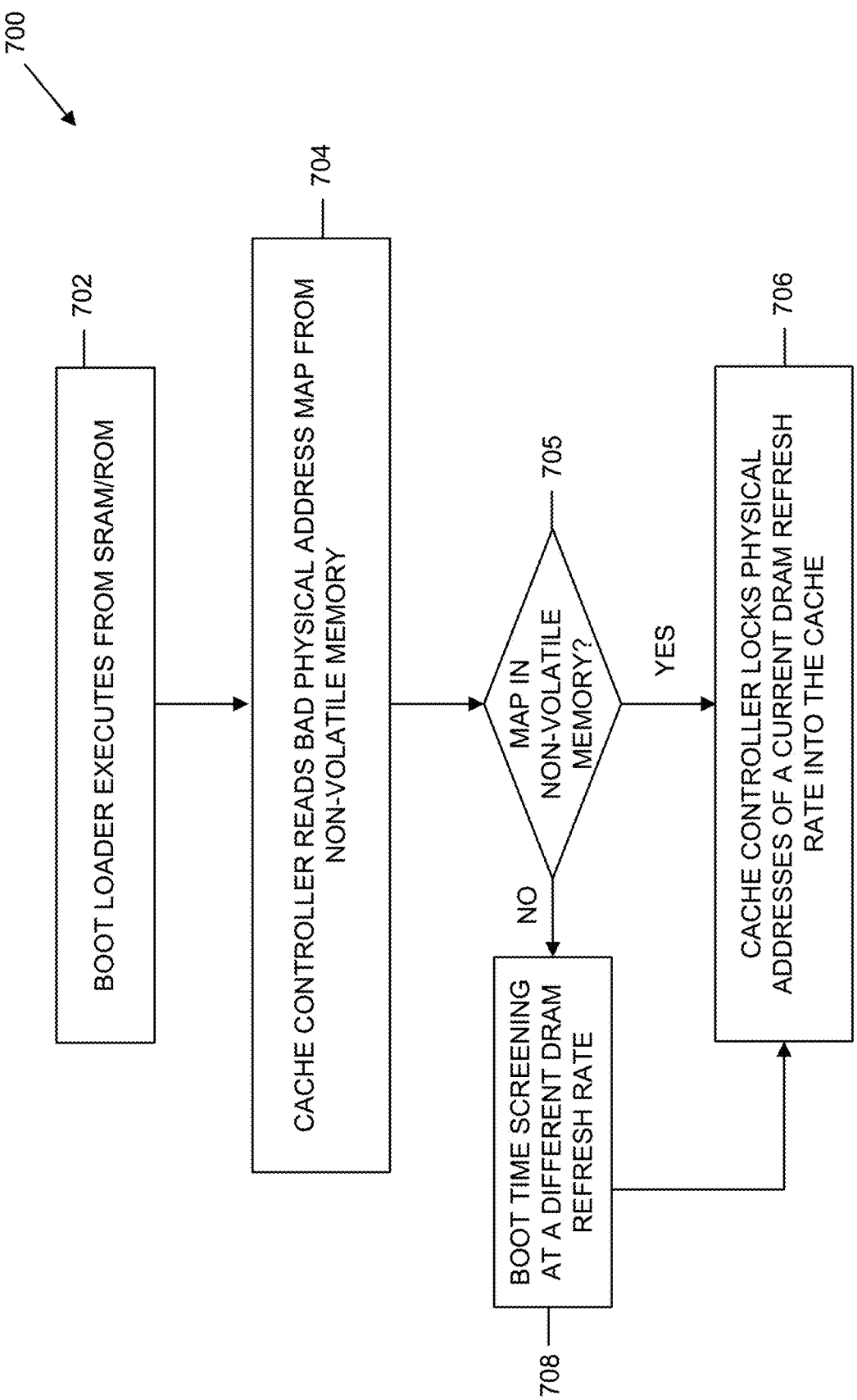
FIG. 7 is a flowchart illustrating an embodiment of a method for initializing the system of FIG. 1.

FIG. 7 is a flowchart illustrating an embodiment of a method 700 for initializing the system 100. During boot, a boot loader running on the CPU 106 and executing from SRAM 110 and/or ROM 112 may start execution of the cache controller 111 (block 702). At block 704, the cache controller 111 reads the bad physical address map 140 from the non-volatile memory 132. If a bad physical address map 140 does not exist on the non-volatile memory 132 (decision block 705), the system 100 may perform a screening test of the DRAM 104 at various refresh rates and store the data in the non-volatile memory 132. In an embodiment, the screening test may be performed at boot time. If the bad physical address map 140 already exists, at block 706, the cache controller 111 uses the data to configure the system cache 113 to prevent further access to the failed codeword addresses corresponding to the current DRAM refresh rate. The cache controller 111 locks the failed codeword addresses in the system cache 113.

Figure 8:
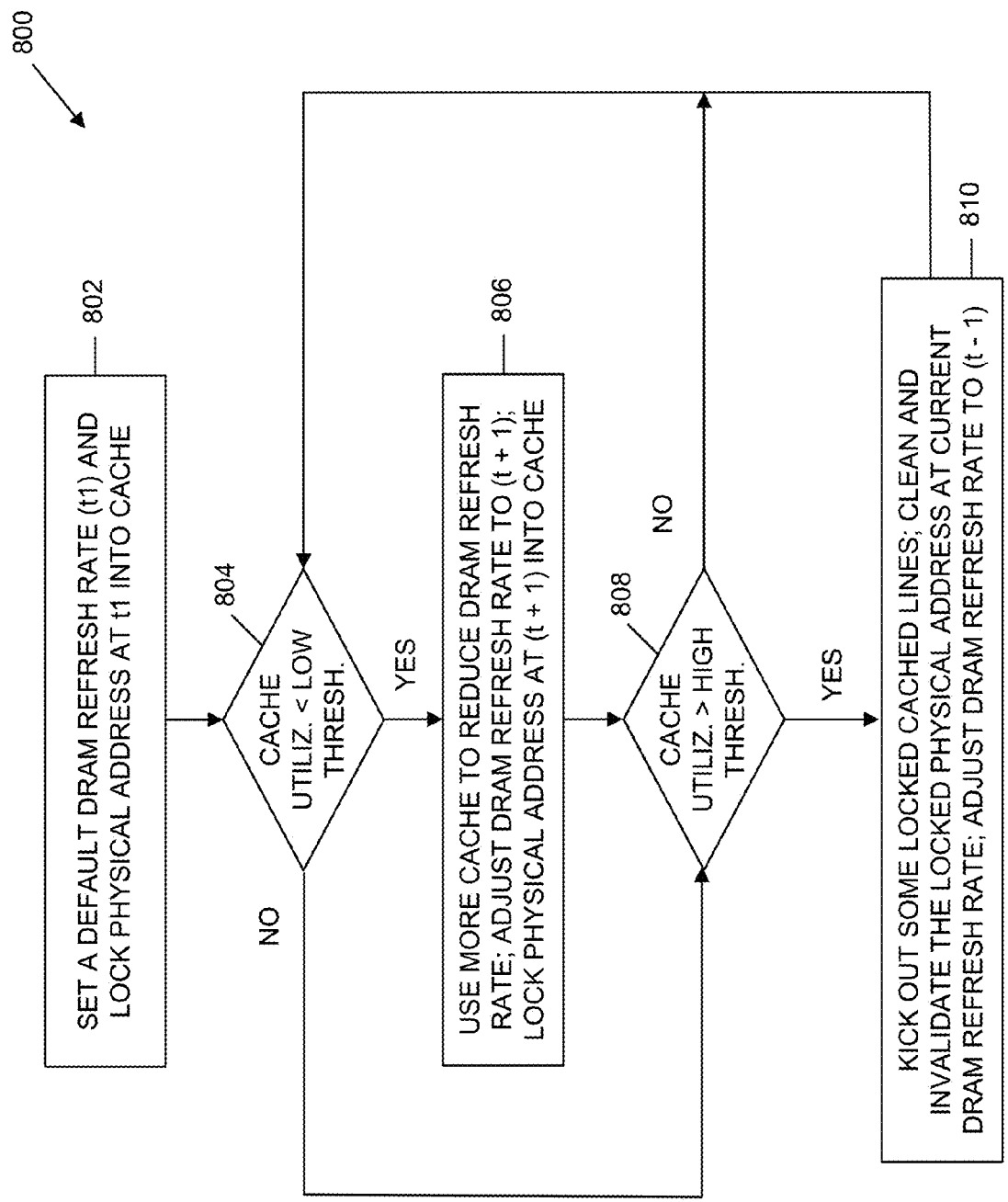
FIG. 8 is a flowchart illustrating an embodiment of a method for adjusting DRAM refresh rates according to the bad physical address map of FIG. 5.

FIG. 8 is a flowchart illustrating an embodiment of a method 800 for adjusting DRAM refresh rates according to the bad physical address map 140 of FIG. 5. At block 802, the system 100 may be set to a default DRAM refresh rate (t1), and the physical addresses at t1 may be locked into the system cache 113. At decision block 804, the system 100 may determine whether the utilization of the system cache 113 as normal cache is less than a predetermined "low" threshold. If "no", the method proceeds to decision block 808. If the system cache utilization is below the predetermined "low" threshold (i.e., "yes"), the system 100 may use more of the system cache 113 to reduce the DRAM refresh rate. The DRAM refresh rate may be reduced to the value (t+1), and the bad physical addresses at (t+1) may be locked into the system cache 113. At decision block 808, the system 100 may determine whether the utilization of the system cache 113 is greater than a predetermined "high" threshold. If "no", the method may return to decision block 804 at a predetermined or programmed interval. If the system cache utilization is greater than the predetermined "high" threshold, at block 810, the system 100 may kick out some locked cache lines in the system cache 113. The locked physical addresses at the current DRAM refresh rate may be cleaned and invalidated, and then the DRAM refresh rate may be increased to the value (t−1).

Figure 9:
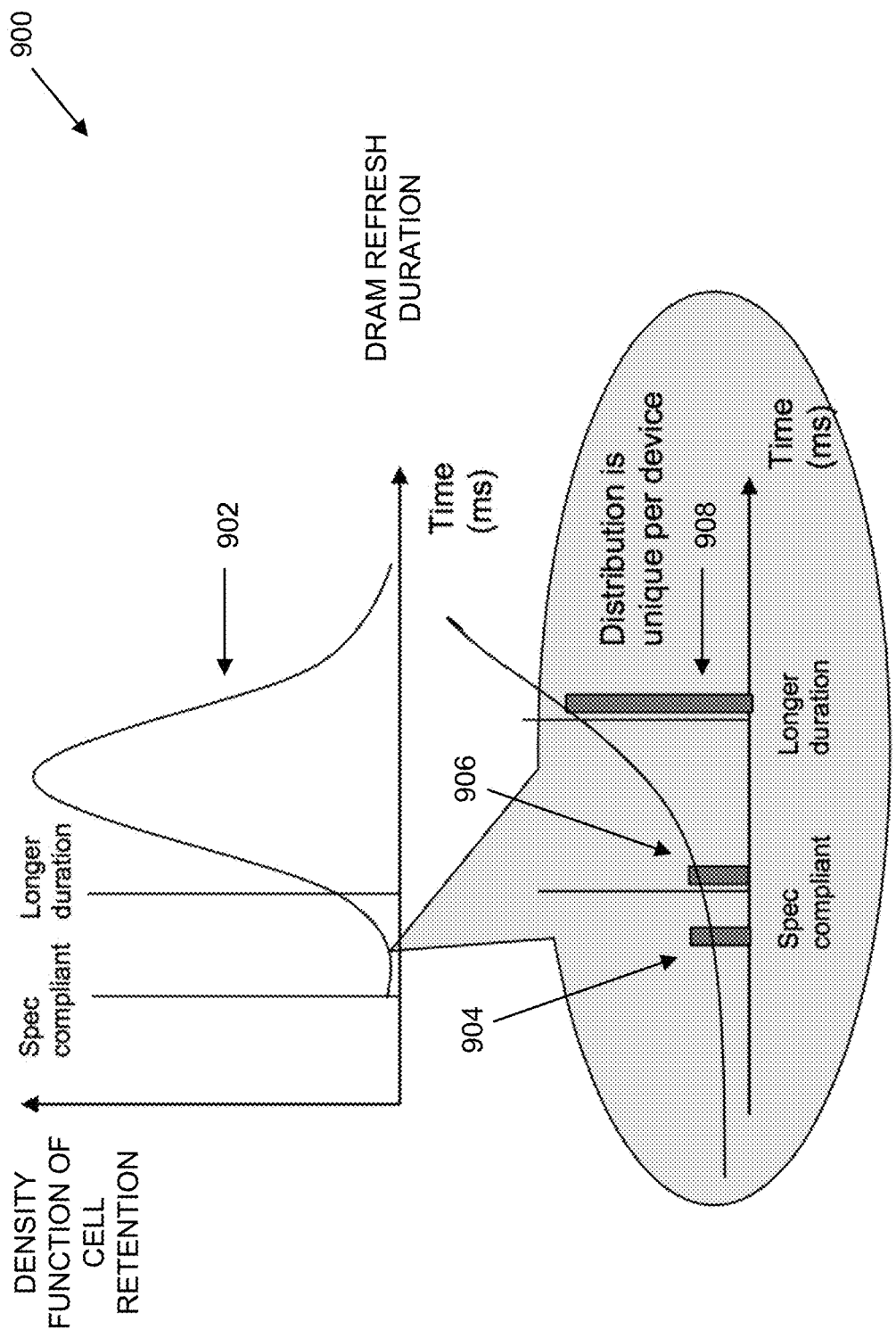
FIG. 9 is a graph illustrating exemplary DRAM refresh rates corresponding to the bad physical address map of FIG. 5.

FIG. 9 is a graph 900 illustrating a histogram of exemplary DRAM refresh rates corresponding to the bad physical address map of FIG. 5. As known in the art, the DRAM 104 may comprise billions of cells, each containing a capacitor that is periodically refreshed. Cell retention time refers to the amount of time that each capacitor can consistently and reliably remain without refreshing and still retain sufficient charge on the capacitor to be correctly read by internal DRAM circuitry (as a "1" or "0"). Due to manufacturing variability, the retention time of each cell capacitor may vary, producing the overall bell-shaped density function 902. The DRAM 104 may be configured to meet a fixed value of cell retention (referred to as "specification compliant") so that SoC 102 or any other system that uses the DRAM 104 can periodically issue the specification compliant refresh timing to the DRAM 104. All DRAM cells may be designed with a mean value of refresh duration to be specification compliant. However, due to variability, a small quantity of weak DRAM cells 904 may exist which require a faster refresh rate (shorter time in milliseconds). During manufacturing and testing, these weak cells 904 may be permanently replaced by a limited quantity of overprovisioned cells so that the entire DRAM 104 has zero weak cells 904 and declared "good". If the limited quantity of overprovisioned cells cannot replace all of the weak cells 904, then the DRAM may be declared "bad".

Figure 12:
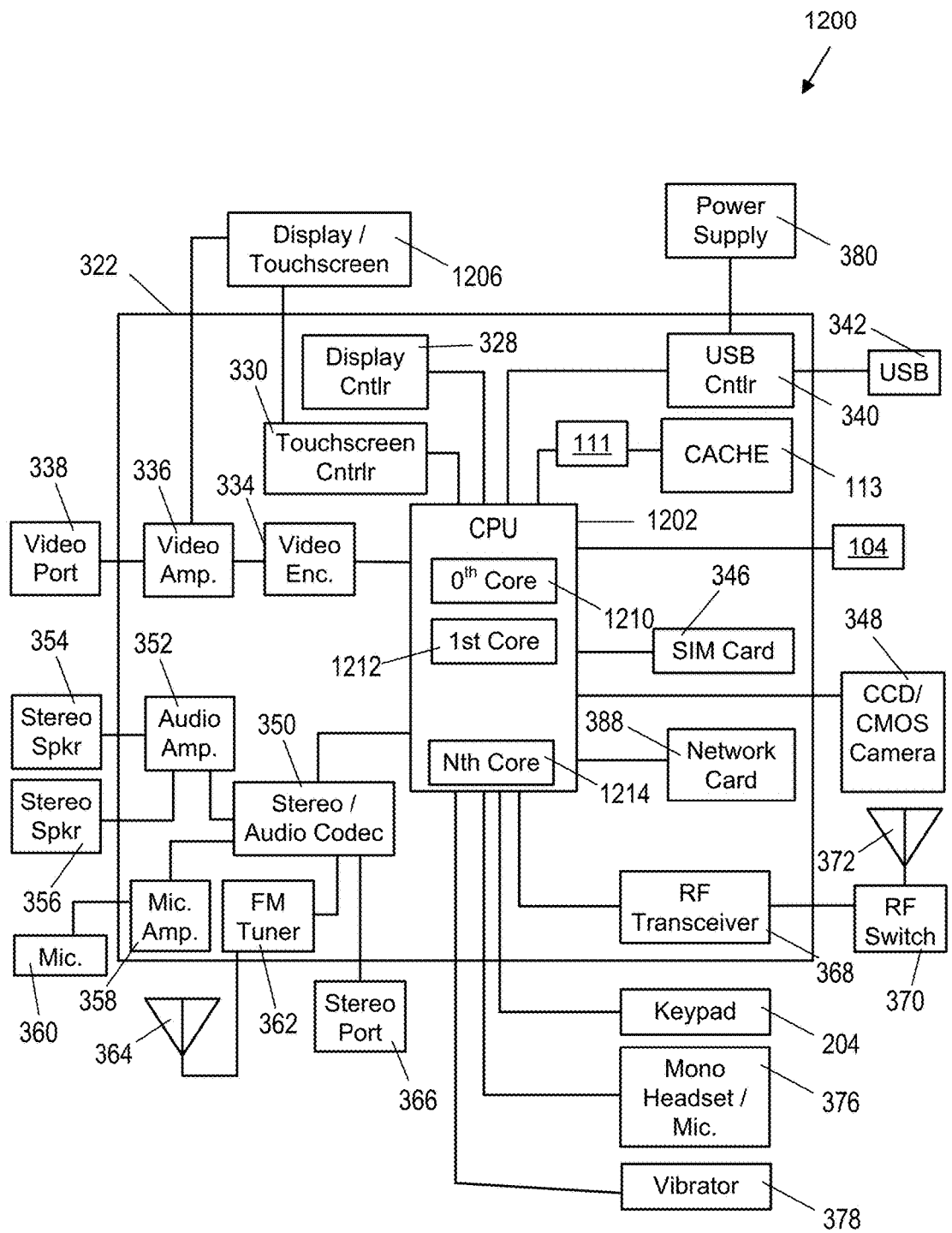
FIG. 12 is a block diagram of an embodiment of a portable computing device for incorporating the system of FIG. 1.

It should be further appreciated that latent defects may appear even with a good DRAM, resulting in the occurrence of a new weak cell 904 after the DRAM 104 has been deployed in a computing device, such as a portable computing device 1200 (FIG. 12). When a latent error occurs, the ECC module 124 is designed to detect, correct, and log any cell error. This correction capability can extend the practical lifetime of the portable computing device 1200. However, the correction strength of the ECC module 124 may not correct multiple errors due to, for example, cost reasons (e.g., the greater the correction strength, the more redundant DRAM cells must be added to store the parity bits). When a permanent latent weak cell causes an error, the ECC module 124 may no longer be able to protect against another error. The system cache 113 (or other on-chip memory) may be used as a replacement for these failing DRAM cells. Referring to FIG. 5, the entries in the table 140 correspond to ECC failures. Column 502 represents the refresh interval setting that resulted in an error and column 504 represents the address within the DRAM 104 pointing to the failed codeword. To reduce the detection of spurious errors (that are not permanent within the DRAM 104), multiple instances of failures for a particular codeword address may be counted before declaring that codeword address is bad.

FIG. 11 illustrates an exemplary embodiment of a cache physical structure 1100 with a set/way association, with limited number of association. A bad address that occurs in the same set index in different ways is illustrated in FIG. 11 as a set n. If all the sets are used to lock the bad physical address, the system 100 may not be able to allocate a cache line for a mission mode use case or further bad physical address locking that may require the same set index. It should be appreciated that this situation may occur due to randomness of bad physical addresses and may result in a conflict of cache allocation that may be prevented via the system 100.

Figure 10:
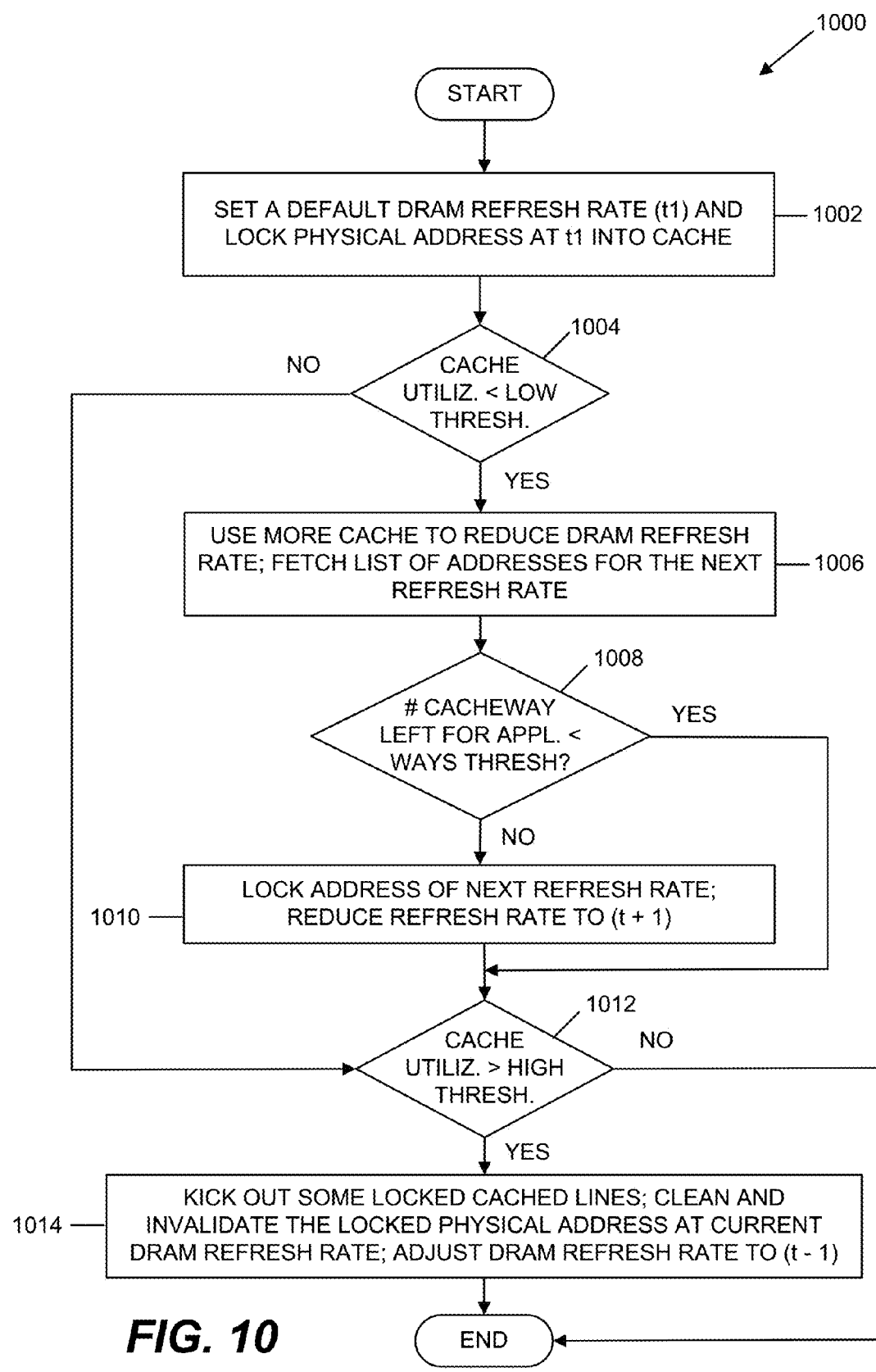
FIG. 10 is a flowchart illustrating an embodiment of a method for resolving cache line allocation conflicts in the system of FIG. 1.

FIG. 10 is a flowchart illustrating an embodiment of a method 1000 for resolving cache line allocation conflicts in the system of FIG. 1. It should be appreciated that block 1006 in FIG. 10 is equivalent to block 806 in FIG. 8. Instead of proceeding to block 808 for decision making if the cache utilization is higher than a preset high threshold, block 1008 may be included for decision making. If the number of cache ways that the locked set index is free for normal operation is lower than a preconfigured tunable ways threshold value, it may bypass the bad address cache locking, therefore ensuring an available set for mission mode use case.

As mentioned above, the system 100 may be incorporated into any desirable computing system. FIG. 12 illustrates the system 100 incorporated in an exemplary portable computing device (PCD) 1200. It will be readily appreciated that certain components of the system 100 are included on the SoC 322 (FIG. 12) while other components (e.g., the DRAM 104) are external components coupled to the SoC 322. The SoC 322 may include a multicore CPU 1202. The multicore CPU 1202 may include a zeroth core 1210, a first core 1212, and an Nth core 1214. One of the cores may comprise, for example, a graphics processing unit (GPU) with one or more of the others comprising the CPU.

A display controller 328 and a touch screen controller 330 may be coupled to the CPU 1202. In turn, the touch screen display 1206 external to the on-chip system 322 may be coupled to the display controller 328 and the touch screen controller 330.

FIG. 12 further shows that a video encoder 334, e.g., a phase alternating line (PAL) encoder, a sequential color a memoire (SECAM) encoder, or a national television system(s) committee (NTSC) encoder, is coupled to the multicore CPU 602. Further, a video amplifier 336 is coupled to the video encoder 334 and the touch screen display 1206. Also, a video port 338 is coupled to the video amplifier 336. As shown in FIG. 12, a universal serial bus (USB) controller 340 is coupled to the multicore CPU 1202. Also, a USB port 342 is coupled to the USB controller 340. Memory 104 and a subscriber identity module (SIM) card 346 may also be coupled to the multicore CPU 1202. Memory 104 resides on the SoC 322. The system cache 113 and the cache controller 111 reside on the SoC 322.

Further, as shown in FIG. 12, a digital camera 348 may be coupled to the multicore CPU 1202. In an exemplary aspect, the digital camera 348 is a charge-coupled device (CCD) camera or a complementary metal-oxide semiconductor (CMOS) camera.

As further illustrated in FIG. 12, a stereo audio coder-decoder (CODEC) 350 may be coupled to the multicore CPU 1202. Moreover, an audio amplifier 352 may coupled to the stereo audio CODEC 350. In an exemplary aspect, a first stereo speaker 354 and a second stereo speaker 356 are coupled to the audio amplifier 352. FIG. 12 shows that a microphone amplifier 358 may be also coupled to the stereo audio CODEC 350. Additionally, a microphone 360 may be coupled to the microphone amplifier 358. In a particular aspect, a frequency modulation (FM) radio tuner 362 may be coupled to the stereo audio CODEC 350. Also, an FM antenna 364 is coupled to the FM radio tuner 362. Further, stereo headphones 366 may be coupled to the stereo audio CODEC 350.

FIG. 12 further illustrates that a radio frequency (RF) transceiver 368 may be coupled to the multicore CPU 1202. An RF switch 370 may be coupled to the RF transceiver 368 and an RF antenna 372. A keypad 204 may be coupled to the multicore CPU 1202. Also, a mono headset with a microphone 376 may be coupled to the multicore CPU 1202. Further, a vibrator device 378 may be coupled to the multicore CPU 1202.

FIG. 12 also shows that a power supply 380 may be coupled to the on-chip system 322. In a particular aspect, the power supply 380 is a direct current (DC) power supply that provides power to the various components of the PCD 1200 that require power. Further, in a particular aspect, the power supply is a rechargeable DC battery or a DC power supply that is derived from an alternating current (AC) to DC transformer that is connected to an AC power source.

FIG. 12 further indicates that the PCD 1200 may also include a network card 388 that may be used to access a data network, e.g., a local area network, a personal area network, or any other network. The network card 388 may be a Bluetooth network card, a WiFi network card, a personal area network (PAN) card, a personal area network ultra-low-power technology (PeANUT) network card, a television/cable/satellite tuner, or any other network card well known in the art. Further, the network card 388 may be incorporated into a chip, i.e., the network card 388 may be a full solution in a chip, and may not be a separate network card 388.

As depicted in FIG. 12, the touch screen display 1206, the video port 338, the USB port 342, the camera 348, the first stereo speaker 354, the second stereo speaker 356, the microphone 360, the FM antenna 364, the stereo headphones 366, the RF switch 370, the RF antenna 372, the keypad 374, the mono headset 376, the vibrator 378, and the power supply 380 may be external to the on-chip system 322.

It should be appreciated that one or more of the method steps described herein may be stored in the memory as computer program instructions, such as the modules described above. These instructions may be executed by any suitable processor in combination or in concert with the corresponding module to perform the methods described herein.

Certain steps in the processes or process flows described in this specification naturally precede others for the invention to function as described. However, the invention is not limited to the order of the steps described if such order or sequence does not alter the functionality of the invention. That is, it is recognized that some steps may performed before, after, or parallel (substantially simultaneously with) other steps without departing from the scope and spirit of the invention. In some instances, certain steps may be omitted or not performed without departing from the invention. Further, words such as "thereafter", "then", "next", etc. are not intended to limit the order of the steps. These words are simply used to guide the reader through the description of the exemplary method.

Additionally, one of ordinary skill in programming is able to write computer code or identify appropriate hardware and/or circuits to implement the disclosed invention without difficulty based on the flow charts and associated description in this specification, for example.

Therefore, disclosure of a particular set of program code instructions or detailed hardware devices is not considered necessary for an adequate understanding of how to make and use the invention. The inventive functionality of the claimed computer implemented processes is explained in more detail in the above description and in conjunction with the Figures which may illustrate various process flows.

In one or more exemplary aspects, the functions described may be implemented in hardware, software, firmware, or any combination thereof. If implemented in software, the functions may be stored on or transmitted as one or more instructions or code on a computer-readable medium. Computer-readable media include both computer storage media and communication media including any medium that facilitates transfer of a computer program from one place to another. A storage media may be any available media that may be accessed by a computer. By way of example, and not limitation, such computer-readable media may comprise RAM, ROM, EEPROM, NAND flash, NOR flash, M-RAM, P-RAM, R-RAM, CD-ROM or other optical disk storage, magnetic disk storage or other magnetic storage devices, or any other medium that may be used to carry or store desired program code in the form of instructions or data structures and that may be accessed by a computer.

Also, any connection is properly termed a computer-readable medium. For example, if the software is transmitted from a website, server, or other remote source using a coaxial cable, fiber optic cable, twisted pair, digital subscriber line ("DSL"), or wireless technologies such as infrared, radio, and microwave, then the coaxial cable, fiber optic cable, twisted pair, DSL, or wireless technologies such as infrared, radio, and microwave are included in the definition of medium.

Disk and disc, as used herein, includes compact disc ("CD"), laser disc, optical disc, digital versatile disc ("DVD"), floppy disk and blu-ray disc where disks usually reproduce data magnetically, while discs reproduce data optically with lasers. Combinations of the above should also be included within the scope of computer-readable media.

Alternative embodiments will become apparent to one of ordinary skill in the art to which the invention pertains without departing from its spirit and scope. Therefore, although selected aspects have been illustrated and described in detail, it will be understood that various substitutions and alterations may be made therein without departing from the spirit and scope of the present invention, as defined by the following claims.

What is claimed is:

1. A system for resolving dynamic random access memory (DRAM) defects, the system comprising:
a dynamic random access memory (DRAM) system; and
a system on chip (SoC) electrically coupled to the DRAM system the SoC comprising a cache and a cache controller, the cache controller configured to determine a failed physical codeword address in the DRAM system in response to error information associated with memory access requests by one or more memory clients, the cache controller configured to store corrected data for a failed physical codeword address in an associated address in the cache and lock a cache line corresponding to the associated address to prevent a clean operation from the one or more memory clients from taking effect, the cache controller configured to respond to a memory access request associated with the failed physical codeword address by a memory client by accessing the associated address in the cache instead of the failed physical codeword address in the DRAM system, the cache controller further configured to unlock the cache line corresponding to the associated address and dynamically adjust a DRAM refresh rate according to a number of failed physical addresses by reducing the DRAM refresh rate in response to an increase in associated addresses in the cache associated with failed codeword addresses in the DRAM system.

2. The system of claim 1, wherein the cache controller is further configured to fetch the corrected data from the DRAM system.

3. The system of claim 1, further comprising an error correcting code (ECC) module for detecting and correcting one or more bit errors associated with the failed codeword address.

4. The system of claim 1, wherein the cache controller determines the failed physical codeword address by determining that a number of errors associated with the failed physical codeword address exceeds an error count threshold.

5. The system of claim 1, wherein the cache controller is further configured to update a bad physical address map stored in a non-volatile memory with the failed physical codeword address.

6. The system of claim 1, embodied in a portable computing device.

7. A method for resolving dynamic random access memory (DRAM) defects, the method comprising:
identifying a failed physical codeword address in a dynamic random access memory (DRAM) electrically coupled to a system on chip (SoC) in response to error information associated with memory transactions initiated by one or more memory clients;
fetching error-corrected data associated with the failed physical codeword address from the DRAM;
storing the error-corrected data in an associated address in a cache residing on the SoC, the associated address in the cache being associated with the failed physical codeword address;
locking a cache line corresponding to the associated address to prevent a clean operation from the one or more memory clients from taking effect;
servicing a memory transaction for the failed physical codeword address from the associated address in the cache instead of the failed physical codeword address in the DRAM;
unlocking the cache line corresponding to the associated address; and
dynamically adjusting a DRAM refresh rate according to a number of failed physical addresses by reducing the DRAM refresh rate in response to an increase in associated addresses in the cache associated with failed codeword addresses in the DRAM system.

8. The method of claim 7, wherein the identifying the failed physical codeword address comprises: determining a number of errors associated with the failed physical codeword address exceeds an error count threshold.

9. The method of claim 7, wherein the identifying the failed physical codeword address comprises: receiving an interrupt signal from a DRAM controller.

10. The method of claim 7, further comprising:
an error correction code (ECC) module detecting and correcting one or more bit errors associated with the failed codeword address; and
storing the error-corrected data in the DRAM.

11. The method of claim 7, further comprising:
storing the failed physical codeword address in a bad physical address map in a non-volatile memory.

12. The method of claim 7, wherein the memory transaction comprises one of a read or write operation.

13. The method of claim 7, wherein the error-corrected data is stored in a cache line.

14. The method of claim 7, wherein the DRAM and the SoC are incorporated in a portable computing device.

15. A system for resolving dynamic random access memory (DRAM) defects, the system comprising:
means for identifying a failed physical codeword address in a dynamic random access memory (DRAM) electrically coupled to a system on chip (SoC) in response to error information associated with memory transactions initiated by one or more memory clients;
means for fetching error-corrected data associated with the failed physical codeword address from the DRAM;
means for storing the error-corrected data in an associated address in a cache residing on the SoC, the associated address in the cache being associated with the failed physical codeword address;
means for locking a cache line corresponding to the associated address to prevent a clean operation from the one or more memory clients from taking effect;

means for servicing a memory transaction for the failed physical codeword address from the associated address in the cache instead of the failed physical codeword address in the DRAM;

means for unlocking the cache line corresponding to the associated address; and means for dynamically adjusting a DRAM refresh rate according to a number of failed physical addresses by reducing the DRAM refresh rate in response to an increase in associated addresses in the cache associated with failed codeword addresses in the DRAM system.

16. The system of claim 15, wherein the means for identifying the failed physical codeword address comprises a cache controller.

17. The system of claim 16, wherein the cache controller is configured to receive an interrupt signal from a DRAM controller.

18. The system of claim 15, wherein the means for identifying the failed physical codeword address comprises: means for determining that a number of errors associated with the failed physical codeword address exceeds an error count threshold.

19. The system of claim 15, further comprising:
means for detecting and correcting one or more bit errors associated with the failed codeword address; and
means for storing the error-corrected data.

20. The system of claim 15, further comprising:
non-volatile memory means for storing the failed physical codeword address in a bad physical address map.

21. The system of claim 15, wherein the memory transaction comprises one of a read or write operation.

22. The system of claim 15, wherein the error-corrected data is stored in a cache line.

23. The system of claim 15, incorporated in a portable computing device.

24. A computer program embodied in a memory and executable by a processor for resolving dynamic random access memory (DRAM) defects, the computer program comprising logic configured to:
identify a failed physical codeword address in a dynamic random access memory (DRAM) electrically coupled to a system on chip (SoC) in response to error information associated with memory transactions initiated by one or more memory clients;
fetch error-corrected data associated with the failed physical codeword address from the DRAM;
store the error-corrected data in an associated address in a cache residing on the SoC, the associated address in the cache being associated with the failed physical codeword address;
lock a cache line corresponding to the associated address to prevent a clean operation from the one or more memory clients from taking effect;
service a memory transaction for the failed physical codeword address from the associated address in the cache instead of the failed physical codeword address in the DRAM;
unlock the cache line corresponding to the associated address; and
adjust a DRAM refresh rate according to a number of failed physical addresses by reducing the DRAM refresh rate in response to an increase in associated addresses in the cache associated with failed codeword addresses in the DRAM system.

25. The computer program of claim 24, wherein the logic configured to identify the failed physical codeword address comprises logic configured to determine a number of errors associated with the failed physical codeword address exceeds an error count threshold.

26. The computer program of claim 24, wherein the logic configured to identify the failed physical codeword address comprises logic configured to receive an interrupt signal from a DRAM controller.

27. The computer program of claim 24, further comprising: logic configured to store the failed physical codeword address in a bad physical address map in a non-volatile memory.

28. The computer program of claim 24, wherein the error-corrected data is stored in a cache line.

29. The computer program of claim 24, incorporated in a portable computing device.

* * * * *